(12) United States Patent
Ide et al.

(10) Patent No.: US 7,589,773 B2
(45) Date of Patent: *Sep. 15, 2009

(54) SOLID-STATE IMAGE SENSOR DEVICE AND DRIVING METHOD

(75) Inventors: Takeshi Ide, Kanagawa (JP); Yasuhiro Ueda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/975,778

(22) Filed: Oct. 22, 2007

(65) Prior Publication Data

US 2008/0068481 A1     Mar. 20, 2008

Related U.S. Application Data

(63) Continuation of application No. 09/324,823, filed on Jun. 2, 1999, now Pat. No. 7,315,328.

(30) Foreign Application Priority Data

Jun. 2, 1998   (JP)   ............... P10-152434

(51) Int. Cl.
*H04N 5/335*   (2006.01)
(52) U.S. Cl. ...................................... 348/294
(58) Field of Classification Search ............ 348/207.99, 348/207.1, 207.11, 222.1, 294, 311, 320–323
See application file for complete search history.

(56) References Cited

U.S. PATENT DOCUMENTS

| | | | |
|---|---|---|---|
| 4,963,980 A | 10/1990 | Suga et al. | |
| 5,122,850 A | 6/1992 | Bukey | |
| 5,264,939 A | 11/1993 | Chang | |
| 5,298,777 A | 3/1994 | Lee | |
| 5,371,033 A | 12/1994 | Lee et al. | |
| 5,523,787 A | 6/1996 | Fukuba | |
| 5,528,291 A | 6/1996 | Oda | |
| 5,828,407 A | 10/1998 | Suzuki | |
| 5,904,493 A | 5/1999 | Lee et al. | |
| 6,342,921 B1 | 1/2002 | Yamaguchi et al. | |
| 6,515,703 B1 | 2/2003 | Suzuki et al. | |
| 6,842,192 B1 | 1/2005 | Suzuki et al. | |
| 7,315,328 B1 * | 1/2008 | Ide et al. ................ 348/311 |
| 2001/0043276 A1 | 11/2001 | Ueno | |

FOREIGN PATENT DOCUMENTS

| | | |
|---|---|---|
| JP | 07-023423 | 1/1995 |
| JP | HEI 07-023423 | 1/1995 |
| JP | 07-131713 | 5/1995 |

(Continued)

*Primary Examiner*—Tuan V Ho
(74) *Attorney, Agent, or Firm*—Robert J. Depke; Rockey, Depke & Lyons, LLC

(57) ABSTRACT

A solid-state image sensor device having an image sensing portion performing the photoelectric conversion and being able to correspond to both progressive mode in which all picture element signals obtained by the scanning of one time are output independently, and interlaced mode in which a plurality of interlaced scannings are performed and the picture element signals obtained by respective interlaced scannings are superposed, comprises a substrate-bias generation circuit for applying a bias voltage to the substrate of the image sensing portion, and for controlling the value of the bias voltage in the progressive mode to be smaller in comparison with that in the interlaced mode.

4 Claims, 4 Drawing Sheets

FOREIGN PATENT DOCUMENTS

| | | |
|---|---|---|
| JP | HEI 07-131713 | 5/1995 |
| JP | 08-009263 | 1/1996 |
| JP | HEI 08-009263 | 1/1996 |
| JP | 09-163239 | 6/1997 |
| JP | HEI 09-163239 | 6/1997 |
| JP | 10-150183 | 6/1998 |
| JP | HEI 10-150183 | 6/1998 |
| JP | 11-008802 | 1/1999 |
| JP | HEI 11-008802 | 1/1999 |

* cited by examiner

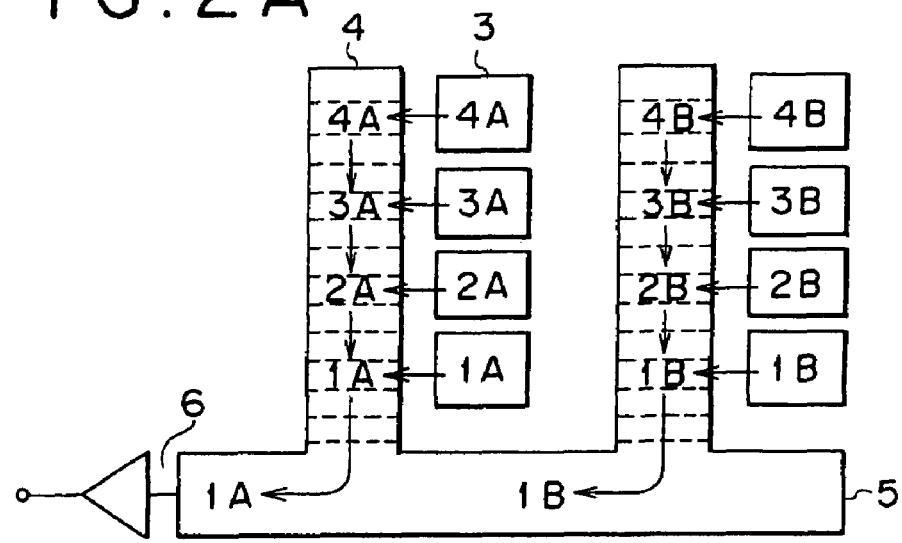
FIG. 2A
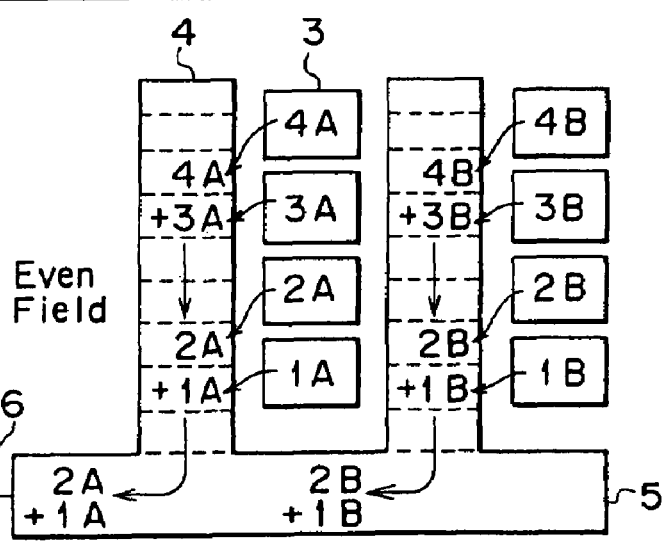
FIG. 2B
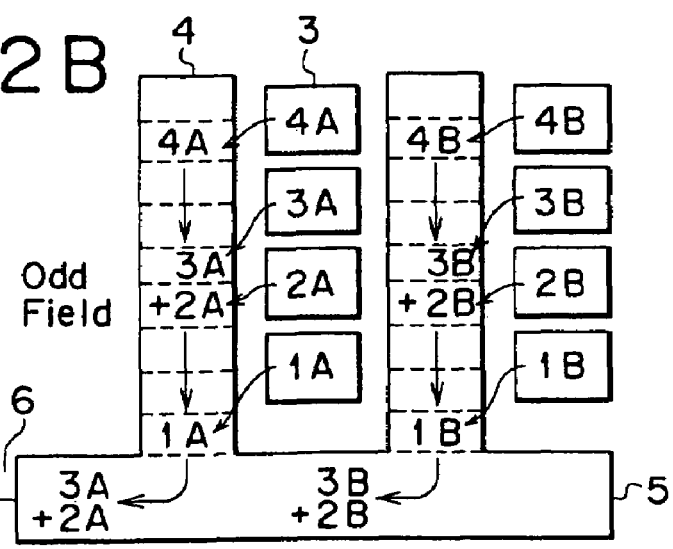

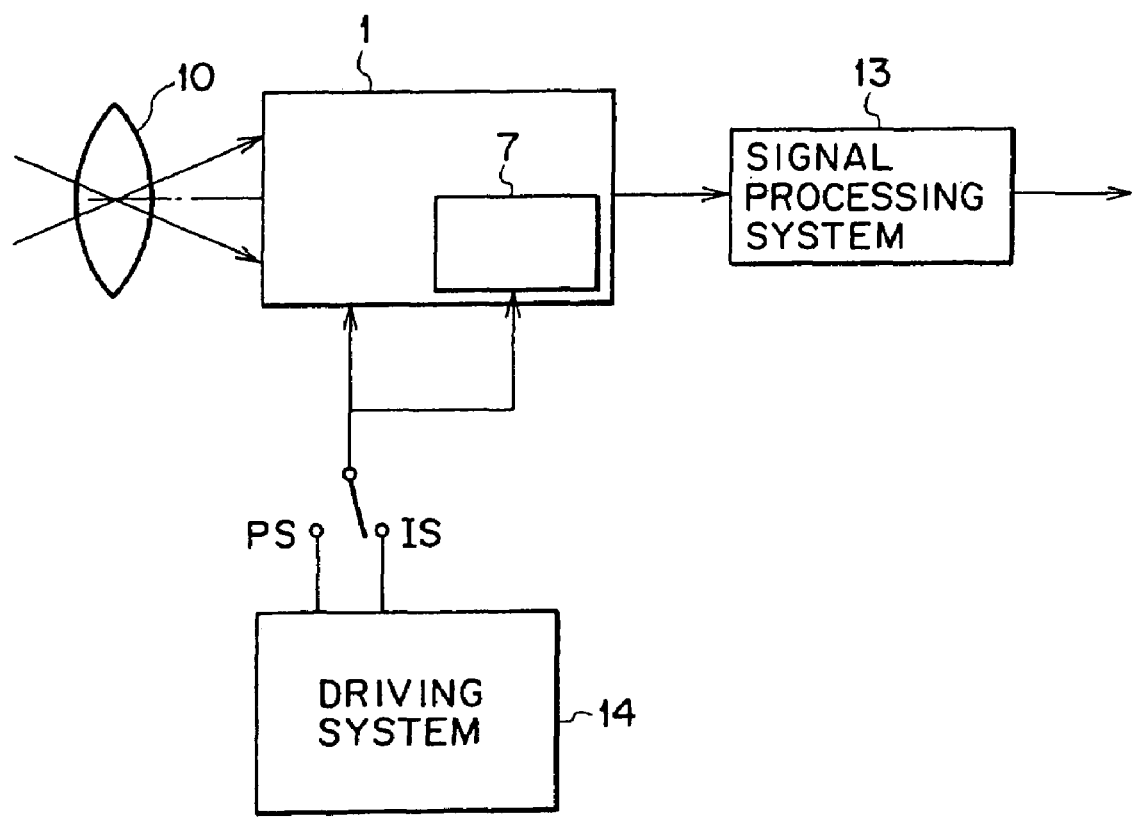

SOLID-STATE IMAGE SENSOR DEVICE AND DRIVING METHOD

The subject matter of application Ser. No. 09/324,823 is incorporated herein by reference. The present application is a continuation of U.S. application Ser. No. 09/324,823, filed Jun. 2, 1999, now U.S. Pat. No. 7,315,328 which claims priority to Japanese Patent Application No. JP 10-152434, filed Jun. 2, 1998. The present application claims priority to these previously filed applications.

BACKGROUND OF THE INVENTION

The present invention relates to a solid-state image sensor-device in which a voltage signal is obtained from an incident light through photoelectric conversion and its driving method, in particular, it relates to a solid-state image sensor device and its driving method being able to correspond to both progressive mode and interlaced mode.

In recent years, a solid-state image sensor device being able to correspond to the read-out of signals in both progressive mode (hereinafter referred to as PS mode) and interlaced mode (hereinafter referred to as IS mode) are known to the public.

In the PS mode, the read-out of signals is performed by a system called the-read-out over the whole picture elements. In other words, when the read-out of signals is performed in the PS mode, all picture element signals obtained by the scanning at one time are independently output without being mixed.

On the other hand, in the IS mode, scanning is performed by a system called an interlaced scanning, for example, 525 scanning lines are scanned alternately, and a first field (even field) and a second field (odd field) are obtained by respective scannings and they are superposed to obtain a frame of an image. In the read-out of signals in the IS mode, element signals being adjacent to each other in the vertical direction are output being mixed, and so called field-read forms a leading system in which at the first time, the first field is scanned, and at the next time, the second field is scanned to fill up the gaps between the first scanning lines.

In a conventional solid-state image sensor device as described in the above, in the IS mode the field-read is performed in which 2 element signals being adjacent to each other in the vertical direction are mixed and output, in contrast to this, in the PS mode, each picture element signal is independently output without being mixed. Therefore, in the PS mode, one signal for each picture element is output, so that a saturate signal quantity becomes a half in comparison with that in the IS mode.

The saturation signal quantity means a maximum signal quantity when a solid-state image sensor device outputs a right signal, in short, it is decided dependent on the quantity of charge which can be accumulated in a photodiode in a solid-state image sensor device corresponding to a picture element in an image. The dynamic range of a solid-state image sensor device is defined by the ratio of the saturation signal quantity to the noise level, therefore the decrease in the saturation signal quantity results in the degradation in the dynamic range.

SUMMARY OF THE INVENTION

The object of the present invention is to offer a solid-state image sensor device and its driving method in which the decrease in the saturation signal quantity in the PS mode to a half of that in the IS mode can be improved even in a case where the device is able to correspond to both PS mode and IS mode.

In order to achieve the above-mentioned object described in the above, according to an aspect of the present invention, there is provided a solid state image sensor device having an image sensing portion in which photoelectric conversion is performed in unit of picture elements and being able to correspond to both PS mode in which all picture element signals obtained in the image sensing portion by the scanning at one time being output independently, and IS mode in which the interlaced scannings of a plurality of times being performed and the picture element signals obtained in each scanning in the image sensing portion being superposed, comprising a substrate bias generation circuit for applying a bias voltage to the substrate of the image sensing portion and for generating a smaller bias voltage in the PS mode in comparison with that in the IS mode.

According to another aspect of the present invention, there is provided a driving method for a solid-state image sensor device, wherein in applying a bias voltage to the substrate of the image sensing portion in the solid-state image sensor device, the bias voltage in the PS mode is controlled to be smaller than that in the IS mode.

According to a further aspect of the present invention, there is provided a camera being composed of a solid-state image sensor device having an image sensing portion performing photoelectric conversion in unit of picture elements and a substrate-bias generation circuit, an optical system in leading in an incident light from a subject onto the image sensing portion and forming its image on it in the solid-state image sensor device, a driving system for driving the solid-state image sensor device, and a signal processing system for processing the output from the solid-state image sensor device to obtain a video signal, wherein the driving system drives the solid-state image sensor device in selectively changing over between PS mode in which all picture element signals are obtained by the scanning of one time in the image sensing portion and IS mode in which a plurality of scannings are performed and the picture element signals obtained in respective scannings are superposed, and the value of the bias voltage to be applied to the substrate by the substrate-bias generation circuit in the PS mode is controlled to be smaller in comparison with that in the IS mode.

According to the solid-state image sensor device having the constitution as described in the above or the driving method for the solid-state image sensor device with the procedures as described in the above, the bias voltage in the PS mode is controlled to be smaller than that in the IS mode, so that the quantity of charge accumulated in each picture element in the PS mode becomes larger in comparison with that in the IS mode. Thereby, the saturation signal quantity in the PS mode is also improved to be equivalent to or close to that in the IS mode with the increase in the quantity of charge in a picture element.

As described in the above, in a solid-state image sensor device and its driving method according to the present invention, in the PS mode, the value of the bias voltage to be applied the substrate is made smaller in comparison with that in the IS mode, so that in the PS mode, the quantity of charge accumulated in each picture element in the image sensing portion becomes larger in comparison with that in the IS mode; thereby, with the phenomenon in the above, the saturation signal quantity in the PS mode is also improved to be equivalent to or close to that in the IS mode. Therefore, even in a case where the solid-state image sensor device is able to correspond to both PS mode and IS mode, it is made possible to prevent the saturation quantity in the PS mode from decreasing to a half of that in the IS mode, and in the result, it is made possible to prevent the dynamic range in the PS mode from being degraded.

BRIEF DESCRIPTION OF THE DRAWINGS

FIGS. 2A, 2B show illustrative drawings for explaining the read-out state of signal charges in the solid-state image sensor device shown in FIG. 1, and FIG. 2A shows an illustrative drawing in the PS mode and FIG. 2B shows illustrative drawings in the IS mode.

FIG. 3A shows a sectional drawing, and FIG. 3B shows a potential drawing.

FIG. 4 shows a block diagram of an example of a camera according to the present invention being composed of an optical system, a solid-state image sensor device and its driving method, and a signal processing system.

DESCRIPTION OF THE PREFERRED EMBODIMENTS

Figure 1:
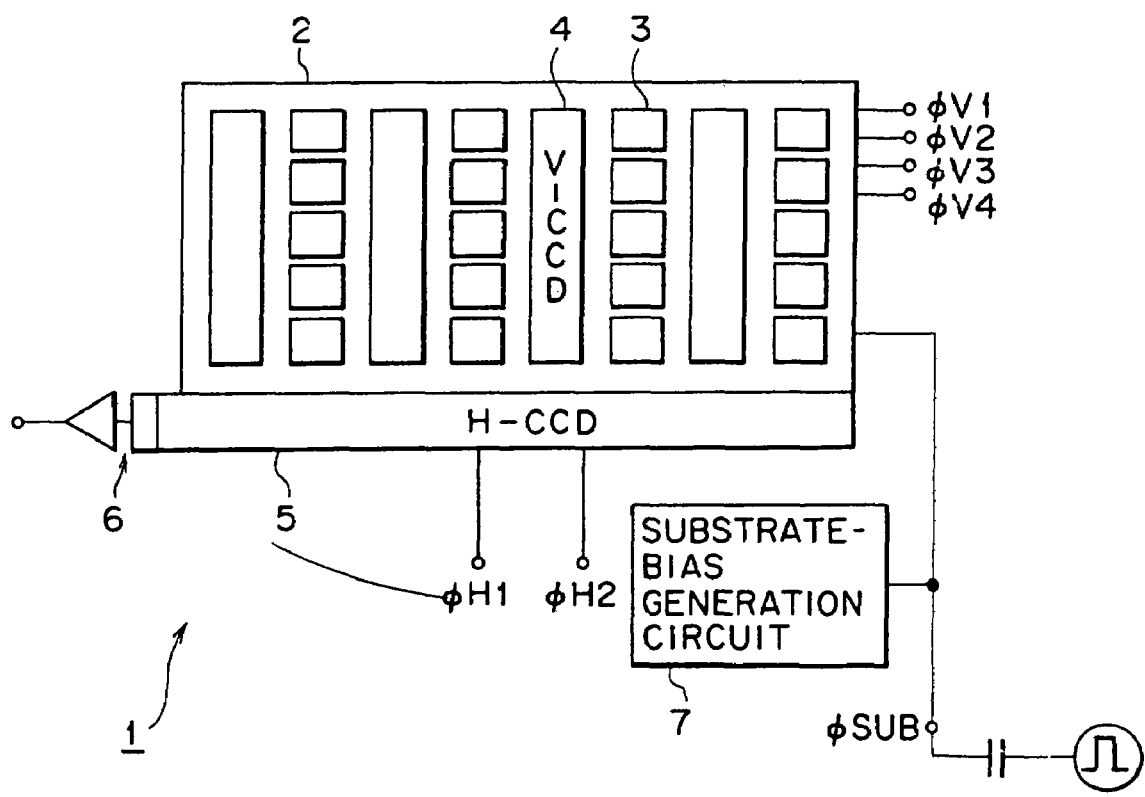
FIG. 1 shows a schematic of the whole of an example of an embodiment of the solid-state image sensor device according to the present invention.

In the following, a solid-state image sensor device and its driving method according to the present invention will be explained referring to the drawings. FIG. 1 shows a schematic of an embodiment of a solid-state image sensor device according to the present invention.

As shown in the figure, a solid-state image sensor device 1 in the present embodiment comprises an image sensing portion 2 in which photoelectric conversion is performed in unit of picture elements. The image sensing portion 2 is composed of a plurality of photodiodes 3 disposed two dimensionally in a matrix form in which an incident light is converted to a signal charge in unit of picture elements and accumulated in it, and a vertical transfer portion (V-CCD) 4 for transferring signal charges read out of each vertical column of the photodiodes 3 in the vertical direction. The V-CCD 4 takes charge of the operation corresponding to a vertical scanning and it is driven in the form of 4 phase-drive by vertical transfer clock pulses, $\phi V1$ to $\phi V4$.

On the output side of the V-CCD 4, a horizontal transfer portion (H-CCD) 5 is provided which transfers the signal charges transferred from the V-CCD 4 in the horizontal direction. The H-CCD 5 takes charge of the operation corresponding to a horizontal scanning and it is driven in the form of 2 phase-drive by horizontal transfer pulses, $\phi H1$ and $\phi H2$.

The solid-state image sensor device 1 is arranged to be able to correspond to both read-out in the PS mode and that in the IS mode in controlling the generation timing of the vertical transfer clock pulses, $\phi V1$ to $\phi V4$, and the horizontal transfer clock pulses, $\phi H1$ and $\phi H2$.

To be more precise, in the PS mode as shown in FIG. 2A, all signal charges accumulated in respective photodiodes 3 are independently, successively output by the scanning of one time without being mixed in the V-CCD 4 or H-CCD 5.

On the other hand, in the IS mode as shown in FIG. 2B, in performing the field-read in which the signal charges obtained from photodiodes 3 being adjacent to each other in the vertical direction are mixed in the V-CCD 4 and output, the interlaced scanning with the first field (Even Field) and the second field (Odd Field) is realized.

As shown in FIG. 1, on the output side of the H-CCD 5, an output portion 6 is provided which detects the transferred signal charges and converts them to voltage signals, and for example, the output portion 6 is composed of a floating diffusion amplifier. The output portion can be of a floating gate constitution in place of the floating diffusion constitution.

Further, the solid-state image sensor device 1 is provided with a substrate-bias generation circuit 7 for applying a bias voltage (hereinafter referred to as $V_{sub.}$) to the substrate of the image sensing portion 2. However, the substrate-bias generation circuit 7 is arranged to apply a predetermined voltage $V_{sub.}$, and further, as described later in detail, the set value of $V_{sub.}$ in the PS mode is arranged to be smaller in comparison with that in the IS mode.

Figure 3A:
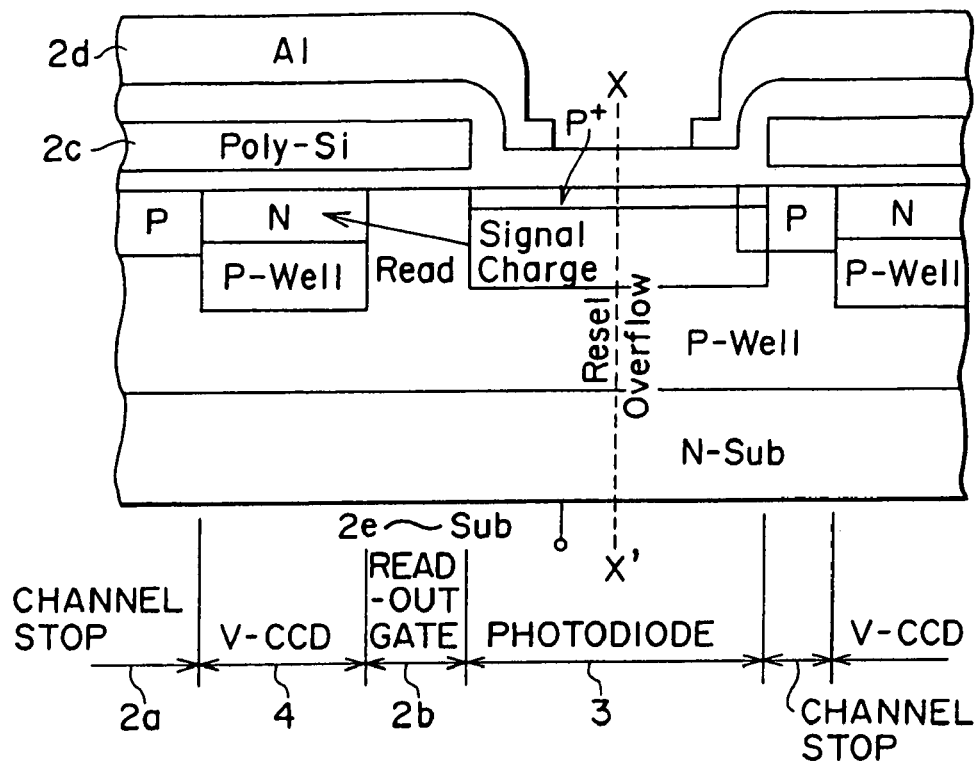
FIGS. 3A, 3B show schematics of the principal parts of the solid-state sensor device shown in FIG. 1.

The image sensing portion 2 to which a $V_{sub.}$ is applied from the substrate-bias generation circuit 7 will be explained in detail referring to FIGS. 3A and 3B in the following.

The image sensing portion 2 is formed with picture element structures called HAD (Hole Accumulated Diode) sensor. In the image sensing portion 2, a channel stop 2a, a V-CCD 4, a read-out gate 2b and photodiodes 3 are disposed in order from the left in the figure, and these are continuously formed close to the surface of the Si substrate.

The potential of the V-CCD 4 and the read-out gate 2b is controlled by a common electrode 2c made of Poly-Si, and following the control, the transfer of signal charges from the photodiodes 3 to the V-CCD 4 and the vertical transfer to be performed later are executed. Over the electrode 2c, an light shielding film 2d made of Al is provided to prevent the occurrence of noise called smear in the signal charges being transferred caused by the incidence of light on the V-CCD 4.

In the upper part of the photodiodes 3, the light shielding film 2d of Al is cut off to form a window to lead the light onto the photodiodes 3. The light incident through the window is converted into photoelectricity by the photodiodes 3 and only the electrons generated in the shallower place than the P-Well are collected in the N type region of a photodiode 3.

In a case where the image sensing portion 2 has a picture element structure called HAD sensor, it is necessary to apply a $V_{sub.}$ to the substrate. For this purpose, on the under surface of the image sensing portion 2, a SUB terminal 2e is provided for applying the $V_{sub.}$ to the substrate.

Figure 3B:
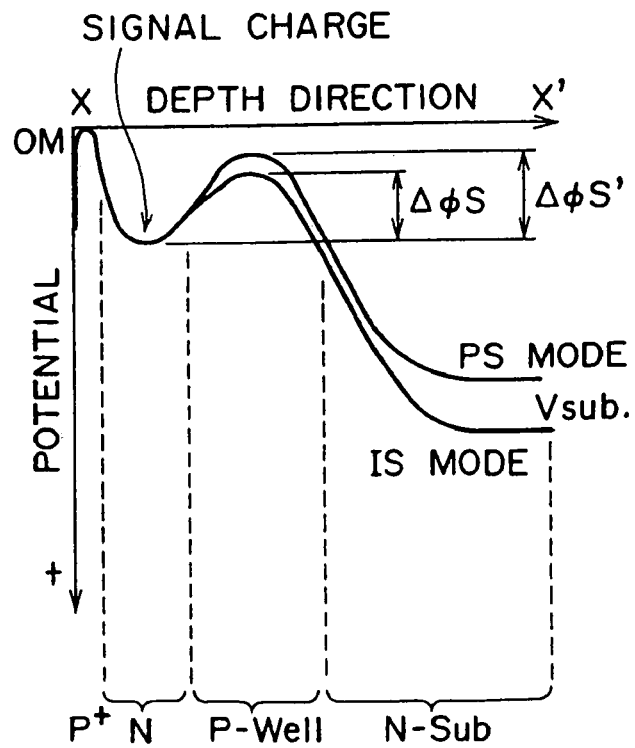

When a $V_{sub.}$ is being supplied to the SUB terminal 2e from the substrate-bias generation circuit 7, that is, when a $V_{sub.}$ is being applied to the substrate, in the photodiode 3, as shown in the potential figure in FIG. 3B, a potential difference $\Delta\phi S$ is generated between the N-type region and the P-Well, and the signal charge can be accumulated corresponding to the potential difference $\Delta\phi S$.

Normally, a $V_{sub.}$ in the order of 12V which is decided inherently in each solid-state image sensor device is given to the SUB terminal 2e. It is arranged in the substrate-bias generation circuit 7, the supply source of $V_{sub.}$, that the set value of $V_{sub.}$ in the PS mode is made smaller in comparison with that in the IS mode. For example, in a case where in the IS mode a $V_{sub.}$ of in the order of 12V is supplied, in the case of PS mode, the set value of the $V_{sub.}$ is made smaller than 12V.

Therefore, in a photodiode 3, as shown in the figure, the potential difference $\Delta\phi S'$ in the PS mode becomes larger than the potential difference $\Delta\phi S$ in the IS mode. With the increase in the potential difference $\Delta\phi S'$, the accumulable quantity of signal charge is also increased. In short, in making the value of the $V_{sub.}$ smaller in comparison with that in the IS mode, more quantity of signal charge can be accumulated in a photodiode 3 than the case of the IS mode.

Therefore, when they are transferred in the vertical direction with the V-CCD 4, after the read-out of the signal charge by the read-out gate 2b, the saturation signal quantity at the time, that is, the saturation signal quantity in the PS mode will be equivalent to or close to that in the IS mode. As a result, it is made possible to improve the decrease in the saturation signal quantity in the PS mode which can be decreased to a half of that in the IS mode.

The quantity of difference between the $V_{sub.}$ in the PS mode and that in the IS mode can be so set beforehand that the saturation signal quantity in the PS mode will be equivalent to or close to that in the IS mode. The changeover between the PS mode and the IS mode will be performed by the substrate-bias generation circuit 7 following the instruction of a higher order circuit (not shown) in matching to the timing of the changeover between the PS mode and the IS mode, that is, the changeover of the generation timing between the vertical transfer clock pulses, $\phi V1$ to $\phi V4$, and the horizontal transfer clock pulses, $\phi H1$ and $\phi H2$.

As mentioned in the above, according to the solid-state image sensor device 1 in the present embodiment, the substrate-bias generation circuit 7 makes the $V_{sub.}$ in the PS mode smaller than that in the IS mode, which makes the accumulated charge in each picture element in the PS mode larger in comparison with that in the IS mode. Following the above, the saturation signal quantity in the PS mode is made to be equivalent to or close to that in the IS mode. Therefore, in the case of the solid-state image sensor device 1, even though it is able to correspond to both PS mode and IS mode, it is made possible to improve the decrease in the saturation signal quantity in the PS mode which has been as small as a half of that in the IS mode. In the result, it is made possible to prevent the degradation in the dynamic range in the PS mode.

However, V-CCD 4 is designed, in general, to be able to handle more charge quantity (Qv) than the saturation signal quantity in the IS mode, so that in the PS mode when the value of $V_{sub.}$ is lowered, there is a fear that blooming is produced, in which white stripes are produced on the upper side and the lower side of an area where the light intensity is large by the surplus charges generated in photodiodes 3. Therefore, in the solid-state image sensor device 1 in the present embodiment, even when the $V_{sub.}$ is lowered, various kinds of conditions (charge handling capacity, etc.) of the image sensing portion 2 are set to be able to secure blooming margin.

FIG. 4 shows a block diagram of an example of a camera according to the present invention using the above-mentioned solid-state image sensor device 1 and its driving method. In FIG. 4, the incident light from a subject is made to form an image of the subject on the image sensing portion of the solid-state image sensor device 1 by an optical system including a lens 10. As a solid-state image sensor device 1, a device having the above-mentioned constitution is used, and the IS mode and the PS mode are selectively changed over by a driving system 14 including a timing generator, etc. in the above-mentioned driving method, and with the operation described in the above, a substrate-bias generation circuit 7 in the solid-state image sensor 1 controls the bias voltage to be applied to the substrate of the solid-state image sensor device 1 in the PS mode to be smaller than that in the IS mode. An output signal from the solid-state image sensor device 1 becomes a video signal, after various kinds of signal processes are given to it in a signal processing system 13.

In the present embodiment, it is explained about the case where the value of $V_{sub.}$ is varied by the substrate-bias generation circuit 7 provided in the solid-state image sensor device 1; however, even in a case where the substrate-bias generation circuit 7 is not provided, if the value of the $V_{sub.}$ to be given to the SUB terminal 2e is made smaller in the PS mode in comparison with that in the IS mode, it is possible to improve the decrease in the saturation signal quantity in the PS mode which can be as small as a half of that in the IS mode. In short, if a solid-state image sensor device is driven by a method according to the present invention, even in a case of a solid-state image sensor device having the same constitution as a conventional one, it is possible to improve the decrease in the saturation signal quantity in the PS mode which can be as small as a half of that in the IS mode. In the result, it is made possible to prevent the degradation in the dynamic range in the PS mode.

What is claimed is:

1. A method of manufacturing a solid-state image sensor device having an image sensing portion performing photoelectric conversion in both progressive mode in which all picture element signals are output independently, and interlaced mode in which interlaced scannings are performed and the picture element signals obtained in respective scannings in said image sensing portion are superimposed, said method of manufacturing comprising:
   providing the image sensing portion having a plurality of photodiodes,
   providing a substrate-bias generation circuit for applying a bias voltage to the substrate of said image sensing portion and for controlling said bias voltage in said progressive mode to be smaller than the bias voltage while operating in the interlaced mode; and
   wherein the applied bias voltages are set such that a saturation signal quantity in the progressive mode is substantially equivalent to that in the interlaced mode.

2. A method of manufacturing a camera comprising:
   providing a solid-state image sensor having an image sensing portion for performing photoelectric conversion;
   providing a substrate-bias generation circuit and a driving system for driving said solid-state image sensor device;
   providing a signal processing system for processing the signal output from said solid-state image sensor device to obtain a video signal, wherein the image sensing portion includes a photodiode structure, and further wherein said driving system selectively operates in progressive mode in which all picture element signals are output independently, and interlaced mode in which a plurality of scannings are performed and the picture element signals obtained in respective scannings are superimposed, and wherein the bias voltage applied to the substrate in said progressive mode is smaller than that in said interlaced mode; and
   wherein the applied bias voltages are chosen such that a saturation signal quantity in the progressive mode is substantially equivalent to that in the interlaced mode.

3. The method of manufacturing a solid-state image sensor device of claim 1, wherein the substrate bias generation circuit adjusts the substrate bias voltage during the progressive mode of operation such that a potential difference is generated between a doped region and a well of each photodiode which is greater than during interlaced operation and further wherein each photodiode is a hole accumulation diode.

4. The method of manufacturing a camera of claim 2, further wherein the substrate bias voltage during the progressive mode of operation is set such that a potential difference is generated between a doped region and a well of the photodiode which is greater than during interlaced operation and further wherein each photodiode is a hole accumulation diode.

* * * * *